(12) United States Patent
Shin et al.

(10) Patent No.: US 9,829,756 B2
(45) Date of Patent: Nov. 28, 2017

(54) DISPLAY DEVICE

(71) Applicant: SAMSUNG DISPLAY CO., LTD., Yongin-si (KR)

(72) Inventors: Donghee Shin, Asan-si (KR); Kyungho Kim, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/090,206

(22) Filed: Apr. 4, 2016

(65) Prior Publication Data

US 2016/0377904 A1    Dec. 29, 2016

(30) Foreign Application Priority Data

Jun. 25, 2015    (KR) .......................... 10-2015-0090637

(51) Int. Cl.
*G02F 1/1345*    (2006.01)
*G02F 1/1368*    (2006.01)
*G02F 1/1362*    (2006.01)
*H01L 27/12*    (2006.01)
(Continued)

(52) U.S. Cl.
CPC ........ *G02F 1/13452* (2013.01); *G02F 1/1368* (2013.01); *G02F 1/13458* (2013.01); *G02F 1/136286* (2013.01); *G09G 3/20* (2013.01); *H01L 25/0652* (2013.01);
(Continued)

(58) Field of Classification Search
CPC .............. G02F 1/13452; G02F 1/1368; G02F 1/13458; G02F 1/136286; H01L 27/124; H01L 25/0652

See application file for complete search history.

(56) References Cited

U.S. PATENT DOCUMENTS

| | | | | |
|---|---|---|---|---|
| 5,652,633 | A | * | 7/1997 | Lee .................... G02F 1/136286 257/59 |
| 7,995,157 | B2 | * | 8/2011 | Song ................. G02F 1/136286 349/139 |

(Continued)

FOREIGN PATENT DOCUMENTS

| | | |
|---|---|---|
| CN | 102789755 | 11/2012 |
| KR | 10-2011-0046843 | 5/2011 |
| KR | 10-2013-0034539 | 4/2013 |

OTHER PUBLICATIONS

English Translation of CN102789755.
European Search Report for European Patent Application No. 16173270.6 Dated Nov. 25, 2016.

*Primary Examiner* — Peniel M Gumedzoe
(74) *Attorney, Agent, or Firm* — F. Chau & Associates, LLC

(57) ABSTRACT

A display device includes a substrate including a plurality of pixels disposed in a display area of the substrate. A non-display area of the substrate is disposed adjacent to the display area. The display device further includes a plurality of gate lines and a plurality of data lines arranged in a matrix form in the display area on the substrate, at least one driver integrated circuit (IC) disposed in the non-display area on the substrate, and a plurality of data fan-out wirings disposed on the substrate and connecting the data lines and the at least one driver IC. Lengths of the data fan-out wirings vary, and the data lines overlap the gate lines more as the lengths of the corresponding data fan-out wirings decrease.

20 Claims, 5 Drawing Sheets

(51) Int. Cl.
    *H01L 25/065*     (2006.01)
    *G09G 3/20*     (2006.01)

(52) U.S. Cl.
    CPC ... *H01L 27/124* (2013.01); *G09G 2300/0426* (2013.01); *G09G 2320/0223* (2013.01)

(56) References Cited

U.S. PATENT DOCUMENTS

| | | | |
|---|---|---|---|
| 8,004,480 B2* | 8/2011 | Kim | G09G 3/3291 345/76 |
| 9,134,583 B2 | 9/2015 | Shim et al. | |
| 2002/0080319 A1* | 6/2002 | Hagiwara | G02F 1/1339 349/153 |
| 2004/0125258 A1 | 7/2004 | Moon et al. | |
| 2007/0285370 A1 | 12/2007 | Kim | |
| 2009/0040166 A1* | 2/2009 | Lee | G02F 1/1345 345/98 |
| 2012/0306826 A1 | 12/2012 | Tsuchi | |
| 2014/0327852 A1 | 11/2014 | Chung et al. | |

* cited by examiner

DISPLAY DEVICE

CROSS-REFERENCE TO RELATED APPLICATIONS

This application claims priority under 35 U.S.C. §119 to Korean Patent Application No. 10-2015-0090637, filed on Jun. 25, 2015, the disclosure of which is incorporated by reference herein in its entirety.

TECHNICAL FIELD

Exemplary embodiments of the present invention relate to a display device.

DISCUSSION OF THE RELATED ART

Display devices may be categorized as being one of, for example, a liquid crystal display (LCD) device, an organic light emitting diode (OLED) display device, a plasma display panel (PDP) display device, or an electrophoretic display (EPD) device.

A display device typically includes pixels connected to gate lines and data lines in a display area. An image is displayed in the display area by the pixels. In addition, the display device may further include at least one driving integrated circuit (IC) disposed in a non-display area adjacent to the display area, and fan-out wirings connecting the at least one driver IC to the gate lines and data lines.

As the size of display devices increases and as the number of the fan-out wirings connected to a single driver IC increases, a variation of length (and thus, a variation of resistance) among the fan-out wirings increases. As a result, a signal delay (e.g., an RC delay) variation may occur among the fan-out wirings, resulting in degradation of display quality.

SUMMARY

Exemplary embodiments of the present invention are directed to a display device having a narrow/thin bezel and capable of achieving uniformity in relation to a signal delay deviation caused by a difference among resistances of fan-out wirings.

According to an exemplary embodiment of the present invention, a display device includes a substrate including a plurality of pixels disposed in a display area of the substrate. A non-display area of the substrate is disposed adjacent to the display area. The display device further includes a plurality of gate lines and a plurality of data lines arranged in a matrix form in the display area on the substrate, at least one driver integrated circuit (IC) disposed in the non-display area on the substrate, and a plurality of data fan-out wirings disposed on the substrate and connecting the data lines and the at least one driver IC. Lengths of the data fan-out wirings vary, and the data lines overlap the gate lines more as the lengths of the corresponding data fan-out wirings decrease.

In an exemplary embodiment, first portions of the data lines overlapping second portions of the gate lines have a greater line width than the second portions.

In an exemplary embodiment, first portions of the gate lines overlapping second portions of the data lines have a greater line width than the second portions.

In an exemplary embodiment, a capacitance between the data lines and the gate lines increases as the length of the corresponding data fan-out wiring decreases.

In an exemplary embodiment, the lengths of the data fan-out wirings are substantially the same as a shortest distance between the driver IC and the corresponding data lines.

In an exemplary embodiment, the data fan-out wirings include a first data fan-out wiring connected to a first data line of the plurality of data lines and an $n^{th}$ data fan-out wiring connected to an $n^{th}$ data line of the plurality of data lines. The length of the first data fan-out wiring is a greatest length among the lengths of the data fan-out wirings, the length of the $n^{th}$ data fan-out wiring is a smallest length among the lengths of the data fan-out wirings, n is an integer greater than or equal to 1, and the $n^{th}$ data fan-out wiring is disposed near a center portion of the at least one driver IC.

In an exemplary embodiment, the lengths of the plurality of data fan-out wirings decrease from the first data fan-out wiring to the $n^{th}$ data fan-out wiring.

In an exemplary embodiment, a resistance of the plurality of data fan-out wirings decreases from the first data fan-out wiring to the nth data fan-out wiring.

In an exemplary embodiment, the data lines overlap the gate lines more from the first data line to the $n^{th}$ data line.

In an exemplary embodiment, a capacitance between the data lines and the gate lines increases from the first data line to the $n^{th}$ data line.

In an exemplary embodiment, the first data fan-out wiring is connected to an end portion of the at least one driver IC.

In an exemplary embodiment, the $n^{th}$ data fan-out wiring is connected to the center portion of the at least one driver IC.

In an exemplary embodiment, the display device further includes an insulating layer disposed between the gate lines and the data lines. The insulating layer insulates the gate lines from the data lines.

In an exemplary embodiment, the at least one driver IC is one of a plurality of driver ICs, and the plurality of driver ICs is arranged at a consistent interval.

According to an exemplary embodiment of the present invention, a display device includes a substrate including a plurality of pixels disposed in a display area of the substrate. A non-display area of the substrate is disposed adjacent to the display area. The display device further includes a plurality of gate lines and a plurality of data lines arranged in a matrix form in the display area on the substrate, at least one driver integrated circuit (IC) disposed in the non-display area on the substrate, and a plurality of data fan-out wirings disposed on the substrate and connecting the data lines and the at least one driver IC. Lengths of the data fan-out wirings decrease from an end portion of the at least one driver IC toward a center portion of the at least one driver IC, and widths of the data lines increase from the end portion of the at least one driver IC toward the center portion of the at least one driver IC.

According to an exemplary embodiment of the present invention, a display device includes a substrate including a plurality of pixels disposed in a display area of the substrate. A non-display area of the substrate is disposed adjacent to the display area. The display device further includes a plurality of gate lines and a plurality of data lines arranged in a matrix form in the display area on the substrate, at least one driver integrated circuit (IC) disposed in the non-display area on the substrate, and plurality of data fan-out wirings disposed on the substrate and connecting the data lines and the at least one driver IC. Lengths of the data fan-out wirings decrease from an end portion of the at least one driver IC toward a center portion of the at least one driver IC, and a capacitance between the data lines and the gate lines increases from the end portion of the at least one driver IC toward the center portion of the at least one driver IC.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Hereinafter, exemplary embodiments of the present invention will be described in more detail with reference to the accompanying drawings.

It will be understood that when a component, such as a film, a region, a layer, or an element, is referred to as being "on", "connected to", "coupled to", or "adjacent to" another component, it can be directly on, connected, electrically connected, coupled, or adjacent to the other component, or intervening components may be present. It will also be understood that when a component is referred to as being "between" two components, it can be the only component between the two components, or one or more intervening components may also be present.

It will be understood that, although the terms "first," "second," "third," etc. may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

It is to be understood that the display device according to exemplary embodiments of the present invention described herein may include, but is not limited to, a liquid crystal display (LCD) device, an organic light emitting diode (OLED) display device or a plasma display panel (PDP) device.

Figure 1:
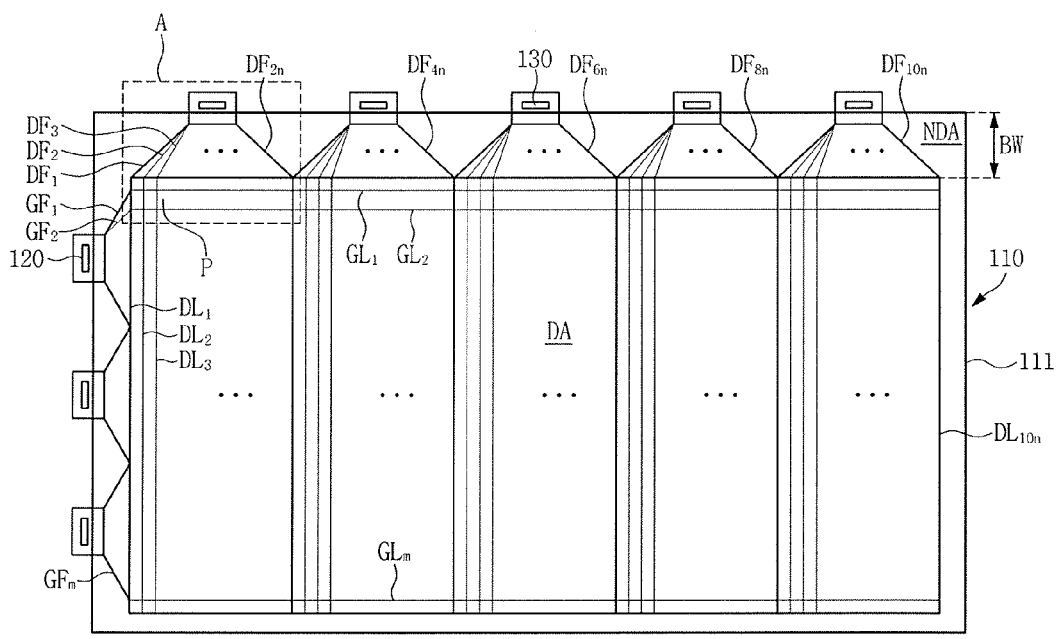
FIG. 1 is a schematic plan view illustrating a display device according to an exemplary embodiment of the present invention.

FIG. 1 is a schematic plan view illustrating a display device according to an exemplary embodiment of the present invention.

In reference to FIG. 1, the display device according to an exemplary embodiment includes a display panel 110 having a display area DA in which an image is displayed and a non-display area NDA disposed adjacent to the display area DA, a gate driver integrated circuit (IC) 120 disposed in the non-display area NDA of the display panel 110, and a data driver IC 130. The non-display area NDA may be referred to herein as surrounding (or being disposed around) the display area DA according to exemplary embodiments. The data driver IC 130 may be one of a plurality of data driver ICs 130, and the plurality of data driver ICs 130 may be arranged at a consistent interval (e.g., the spaces between all adjacent data driver ICs 130 of the plurality of data driver ICs 130 may be substantially the same).

The display panel 110 includes a first substrate 111, a second substrate opposing the first substrate 111, and a liquid crystal layer disposed between the first substrate 111 and the second substrate. For convenience of description, the second substrate and the liquid crystal layer are omitted in FIG. 1.

The display panel 110 includes a plurality of pixels P arranged in the display area DA of the first substrate 111 in an $m*_{10n}$ matrix form, a plurality of gate lines $GL_1$–$GL_m$ that applies scan signals to the respective pixels P, and a plurality of data lines $DL_1$–$DL_{10n}$ that applies data voltages to the respective pixels P (in which m and n are integers greater than or equal to 1). Although the display panel 110 according to an exemplary embodiment as shown in FIG. 1 is described herein as including the plurality of pixels P arranged in an $m*_{10n}$ matrix form, exemplary embodiments of the present invention are not limited thereto.

Each of the pixels P may include a thin film transistor and a pixel electrode connected to the thin film transistor. Each thin film transistor includes a gate electrode extending from the aforementioned gate lines $GL_1$~$GL_m$, a source electrode extending from the aforementioned data lines $DL_1$~$DL_{10n}$, and a drain electrode connected to the corresponding pixel electrode.

In addition, the display panel 110 includes a plurality of pads disposed in the non-display area NDA of the first substrate 111, a plurality of gate fan-out lines $GF_1$~$GF_m$ connecting the plurality of gate lines $GL_1$~$GL_m$ to the plurality of pads in one-to-one correspondence, and a plurality of data fan-out lines $DF_1$~$DF_{10n}$ connecting the plurality of data lines $DL_1$~$DL_{10n}$ to the plurality of pads in one-to-one correspondence. The plurality of data fan-out lines $DF_1$~$DF_{10n}$ may also be referred to herein as a plurality of data fan-out wirings $DF_1$~$DF_{10n}$.

The gate driver IC 120 and the data driver IC 130 are respectively connected to the gate lines $GL_1$~$GL_m$ and the data lines $DL_1$~$DL_{10n}$ through the plurality of pads. The gate driver IC 120 and the data driver IC 130 are connected to the plurality of pads through a mounting structure such as, for example, a tape carrier package ("TCP"), a chip on glass ("COG"), and a chip on film ("COF"). However, the mounting structure is not limited thereto.

The gate driver IC 120 may sequentially turn on or turn off the thin film transistors provided in the pixels P according to an externally input control signal (e.g., an input control signal received from a source external to the display panel 110). The gate driver IC 120 includes a plurality of shift registers. The plurality of shift registers sequentially applies scan signals generated in response to the externally input control signal to the pixels P through the gate lines $GL_1$~$GL_m$.

The data driver IC 130 selects reference voltages of data for displaying an image in response to the externally input control signal in synchronization with the aforementioned gate driver 120, and applies the selected reference voltages to the pixels P through the data lines $DL_1 \sim DL_{10n}$. In an exemplary embodiment, the data driver IC 130 may be connected to a reference-voltage generating element (e.g., a reference-voltage generating circuit), may receive the generated reference voltages from the reference-voltage generating element, and may apply the reference voltages to the pixels P.

Although the display device according to an exemplary embodiment is described as including three gate driver ICs 120 and five data driver ICs 130 as illustrated in FIG. 1, exemplary embodiments of the present invention are not limited thereto. For example, according to exemplary embodiments, the display device may include various numbers of gate driver ICs 120 and data driver ICs 130.

According to exemplary embodiments of the present invention, the display device includes 10n data lines $DL_1 \sim DL_{10n}$ and five data driver ICs 130. Each of the data driver ICs 130 is connected to 2n data lines. As an example, in a case in which the number of data lines $DL_1 \sim DL_{10n}$ is 3000, the five data driver ICs 130 may be connected to 600 data lines.

According to exemplary embodiments of the present invention, the size of the display device may be reduced. For example, a width BW of the non-display area NDA, in which the plurality of data fan-out wirings $DF_1 \sim DF_{10n}$ is disposed, may be reduced/narrowed to achieve a narrow/thin bezel. To this end, according to exemplary embodiments, the data fan-out wirings $DF_1 \sim DF_{10n}$ are formed to have a length substantially the same as a shortest distance among the respective data lines $DL_1 \sim DL_{10n}$ and the data driver ICs 130 corresponding to the respective data lines $DL_1 \sim DL_{10n}$. That is, the length of each of the data fan-out wiring $DF_1 \sim DF_{10n}$ is substantially the same as the shortest distance between its corresponding data line from among data lines $DL_1 \sim DL_{10n}$ and the data driver IC 130.

Hereinafter, a method of uniformly compensating for a signal delay deviation caused by a difference in length (and as a result, a difference in resistance) of the data fan-out wirings $DF_1 \sim DF_{10n}$ will be described.

Figure 2:
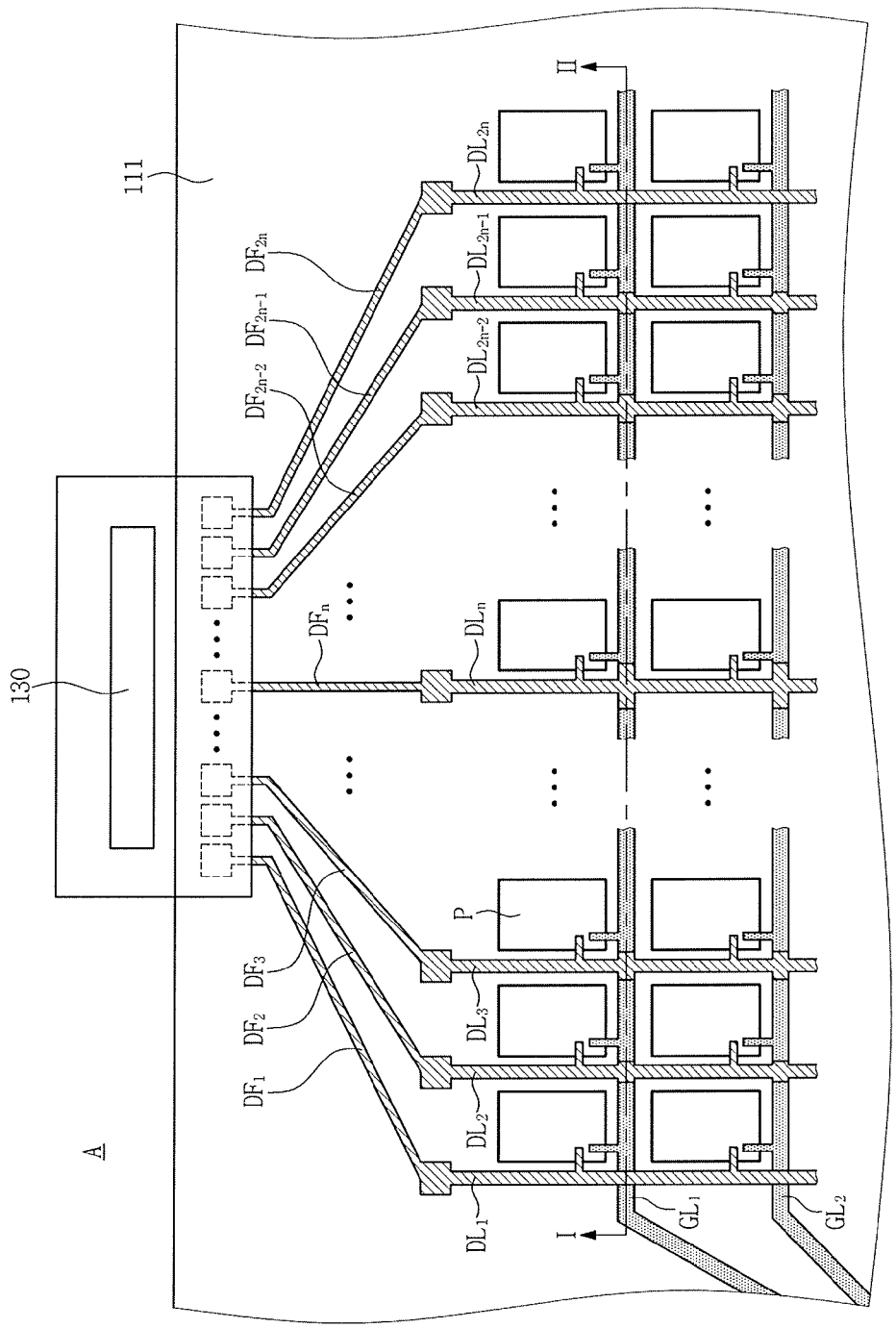
FIG. 2 is an enlarged view illustrating portion A of the display device of FIG. 1 according to an exemplary embodiment of the present invention.

FIG. 2 is an enlarged view illustrating portion A of the display device of FIG. 1 according to an exemplary embodiment of the present invention. It is to be understood that according to exemplary embodiments, the structure including the single data driver IC 130 and the data fan-out wirings $DF_1 \sim DF_{2n}$ connected to the single data drive IC 130 illustrated in FIG. 2 is applicable to the other data driver ICs and data fan-out wirings connected to the other data driver ICs.

In reference to FIG. 2, the display device according to an exemplary embodiment may be formed to have a length substantially the same as a shortest distance between the data driver IC 130 and the data lines $DL_1 \sim DL_{2n}$. As a result, a narrow/thin bezel may be achieved.

Hereinafter, an exemplary embodiment will be described in which the first data fan-out wiring $DF_1$ and the $2n^{th}$ data fan-out wiring $DF_{2n}$ are connected to a peripheral portion (also referred to herein as a side portion or an end portion) of the data driver IC 130, and the $n^{th}$ data fan-out wiring $DF_n$ is connected to a center portion of the data driver IC 130. According to exemplary embodiments of the present invention, the center portion of the data driver IC 130 may be defined as the portion at which the $n^{th}$ data fan-out wiring $DF_n$ is connected to the data driver IC 130, and the peripheral portion may be collectively defined as the portions of the data driver IC 130 adjacent to the center portion. The first data fan-out wiring $DF_1$ and the $2n^{th}$ data fan-out wiring $DF_{2n}$ may be disposed in an area (e.g., at an end) of the peripheral portions furthest from the center portion, and lengths of the data fan-out wirings $DF_1 \sim DF_{2n}$ may decrease from the ends of the peripheral portions toward the center portion.

The data fan-out wiring $DF_n$ connected to the data line $DL_n$ disposed relatively adjacent to a center portion of the data driver IC 130 has a smallest length, and thus, a smallest resistance, from among the data fan-out wirings $DF_1 \sim DF_{2n}$. The length, and thus, the resistance of the data fan-out wirings $DF_1 \sim DF_{2n}$ increases as the data fan-out wirings $DF_1 \sim DF_{2n}$ are disposed further away from the data fan-out wiring $DF_n$ disposed near the center portion of the data driver IC 130. Thus, the data fan-out wirings $DF_1$ and $DF_{2n}$ disposed near ends of the data driver IC 130 and furthest away from the data fan-out wiring $DF_n$ have the greatest length, and thus, the greatest resistance.

That is, according to exemplary embodiments, the resistance decreases from the first data fan-out wiring $DF_1$ to the $n^{th}$ data fan-out wiring $DF_n$, and increases from the $n^{th}$ data fan-out wiring $DF_n$ to the $2n^{th}$ data fan-out wiring $DF_{2n}$.

The display device according to exemplary embodiments allows overlapping areas among the respective data lines $DL_1 \sim DL_{2n}$ respectively connected to the data fan-out wirings $DF_1 \sim DF_{2n}$ and the gate lines $GL_1 \sim GL_m$ to be different from one another so as to compensate for the resistance deviation among the data fan-out wirings $DF_1 \sim DF_{2n}$.

That is, by allowing parasitic capacitances formed between the respective data lines $DL_1 \sim DL_{2n}$ and the gate lines $GL_1 \sim GL_m$ to have different capacities for each of the data lines $DL_1 \sim DL_{2n}$, the signal delay deviation caused by the difference in length (and thus, the difference in resistance) of the data fan-out wirings $DF_1 \sim DF_{2n}$ may be uniformly compensated.

Figure 3:
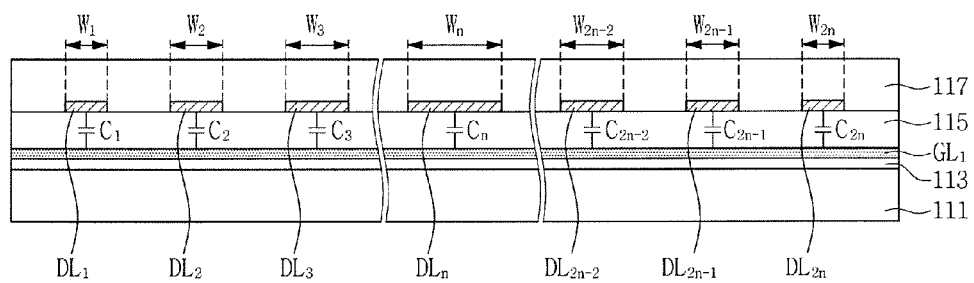
FIG. 3 is a cross-sectional view taken along line I-II of FIG. 2 according to an exemplary embodiment of the present invention.

For example, an overlapping area of the data lines $DL_1$ and $DL_{2n}$, which are connected to the data fan-out wirings $DF_1$ and $DF_{2n}$ having the greatest length and the gate lines $GL_1 \sim GL_m$, is the smallest among the overlapping areas, and an overlapping area of the data line $DL_n$, which is connected to the data fan-out wiring $DF_n$ having the smallest length and the gate lines $GL_1 \sim GL_m$, is the greatest among the overlapping areas. In addition, the overlapping area increases from the first data line $DL_1$ to the $n^{th}$ data line $DL_n$, and the overlapping area decreases from the $n^{th}$ data line $DL_n$ to the $2n^{th}$ data line $DL_{2n}$. For example, as shown in FIG. 3, which is described in further detail below, according to exemplary embodiments, each of the data lines $DL_1 \sim DL_{2n}$ has a different width. The width of the data lines $DL_1$ and $DL_{2n}$ closest to the end portions of the data driver IC 130 is the smallest among the widths, and thus, these data lines overlap the gate lines $GL_1 \sim GL_m$ the least. As the data lines $DL_1 \sim DL_{2n}$ are disposed more toward the center portion of the data driver IC 130, the widths of the data lines $DL_1 \sim DL_{2n}$ increase, with the data line nearest the center portion (e.g., data line $DL_n$) having the greatest width, and thus, overlapping the gate lines $GL_1 \sim GL_m$ the most. Thus, according to exemplary embodiments of the present invention, as the length of the data fan-out wirings $DF_1 \sim DF_{2n}$ decreases (e.g., as the data fan-out wirings $DF_1 \sim DF_{2n}$ are disposed further from the end portions and closer to the center portion of the data driver IC 130), the corresponding connected data lines $DL_1 \sim DL_{2n}$ overlap the gate lines $GL_1 \sim GL_m$ more.

In the display device according to exemplary embodiments of the present invention, portions of the data lines $DL_1$~$DL_{2n}$ (e.g., referred to herein as first portions) overlapping portions of the gate lines $GL_1$~$GL_m$ (e.g., referred to herein as second portions) have a greater line width than the corresponding second portions. The line width of the portion of the respective data lines $DL_1$~$DL_{2n}$ overlapping the gate lines $GL_1$~$GL_m$ increases from the first data line $DL_1$ to the $n^{th}$ data line $DL_n$, and decreases from the $n^{th}$ data line $DL_n$ to the $2n^{th}$ data line $DL_{2n}$, as described further below.

FIG. 3 is a cross-sectional view taken along line I-II of FIG. 2 according to an exemplary embodiment of the present invention.

In reference to FIG. 3, the display panel 110 according to an exemplary embodiment may include the first substrate 111, a buffer layer 113 disposed on the first substrate 111, the first gate line $GL_1$ disposed on the buffer layer 113, a gate insulating layer 115 disposed on the first gate line $GL_1$, the data lines $DL_1$~$DL_{2n}$ disposed on the gate insulating layer 115, and an insulating interlayer 117 disposed on the data lines $DL_1$~$DL_{2n}$.

The first substrate 111 may be a transparent insulating substrate formed of, for example, glass, tempered glass, transparent plastic, etc.

The buffer layer 113 is configured to prevent infiltration of undesirable elements and to planarize a surface. According to exemplary embodiments, the buffer layer 113 may be omitted.

The gate insulating layer 115 and the insulating interlayer 117 may include at least one of, for example, silicon nitride (SiNx) and silicon oxide (SiO2).

The first gate line $GL_1$ and the data lines $DL_1$~$DL_{2n}$ may be formed of, for example, aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). However, exemplary embodiments are not limited thereto.

The line widths $W_1$~$W_{2n}$ of the portion of the respective data lines $DL_1$~$DL_{2n}$ overlapping the first gate line $GL_1$ increase from the first data line $DL_1$ to the $n^{th}$ data line $DL_n$, and decrease from the $n^{th}$ data line $DL_n$ to the $2n^{th}$ data line $DL_{2n}$.

Accordingly, the capacitances $C_1$~$C_{2n}$ generated between the respective data lines $DL_1$~$DL_{2n}$ and the first gate line $GL_1$ increase from the first data line $DL_1$ to the $n^{th}$ data line $DL_n$, and decrease from the $n^{th}$ data line $DL_n$ to the $2n^{th}$ data line $DL_{2n}$.

Figure 4:
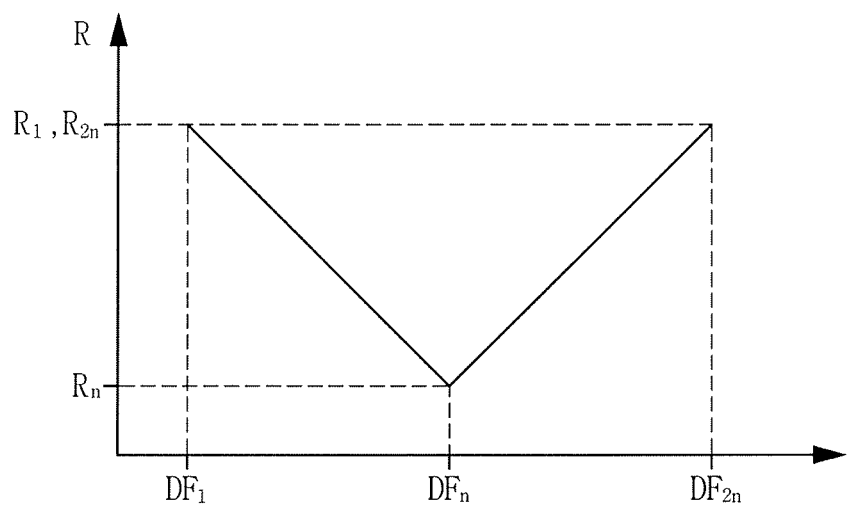
FIG. 4 is a graph illustrating the resistance of data fan-out wirings according to an exemplary embodiment of the present invention.
Figure 5:
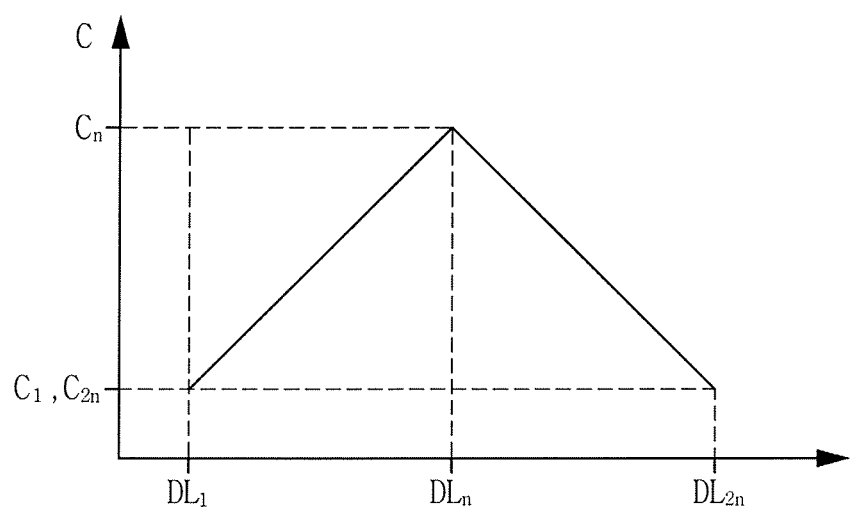
FIG. 5 is a graph illustrating the capacitance between the data lines connected to the data fan-out wirings and the gate lines according to an exemplary embodiment of the present invention.

FIG. 4 is a graph illustrating the resistance R of the data fan-out wirings $DF_1$~$DF_{2n}$, according to an exemplary embodiment of the present invention. FIG. 5 is a graph illustrating the capacitance C between the data lines $DL_1$~$DL_{2n}$ connected to the data fan-out wirings $DF_1$~$DF_{2n}$ and the gate lines $GL_1$~$GL_m$ according to an exemplary embodiment of the present invention.

In reference to FIG. 4, a resistance $R_1$ of the first data fan-out wiring $DF_1$ and a resistance $R_{2n}$ of the $2n^{th}$ data fan-out wiring $DF_{2n}$ are the greatest among the resistances of the data fan-out wirings $DF_1$~$DF_{2n}$, and a resistance Rn of the $n^{th}$ data fan-out wiring $DF_n$ is the smallest among the resistances of the data fan-out wirings $DF_1$~$DF_{2n}$.

In addition, the resistance R decreases from the first data fan-out wiring $DF_1$ to the $n^{th}$ data fan-out wiring $DF_n$, and increases from the $n^{th}$ data fan-out wiring $DF_n$ to the $2n^{th}$ data fan-out wiring $DF_{2n}$.

In reference to FIG. 5, a capacitance $C_1$ between the first data line $DL_1$ and the gate lines $GL_1$~$GL_m$ and a capacitance $C_{2n}$ between the $2n^{th}$ data line $DL_{2n}$ and the gate lines $GL_1$~$GL_m$ are the smallest among the capacitances between the data lines and the gate lines, and a capacitance Cn between the $n^{th}$ data line $DL_n$ and the gate lines $GL_1$~$GL_m$ is the greatest among the capacitances between the data lines and the gate lines.

In addition, the capacitance C between the data lines $DL_1$~$DL_{2n}$ and the gate lines $GL_1$~$GL_m$ increases from the first data line $DL_1$ to the $n^{th}$ data line $DL_n$, and decreases from the $n^{th}$ data line $DL_n$ to the $2n^{th}$ data line $DL_{2n}$.

As a result, in the display device according to exemplary embodiments of the present invention, as the length of the data fan-out wirings $DF_1$~$DF_{2n}$ decreases (and thus, as the resistance thereof decreases), an overlapping area among the data lines $DL_1$~$DL_{2n}$ respectively connected to the data fan-out wirings $DF_1$~$DF_{2n}$ and the gate lines $GL_1$~$GL_m$ increases (and thus, the capacitance thereof increases), such that the signal delay deviation caused by the difference in length (and thus, the difference in resistance) of the data fan-out wirings $DF_1$~$DF_{2n}$ may be uniformly compensated.

In addition, in the display device according to exemplary embodiments of the present invention, as the length of the data fan-out wirings $DF_1$~$DF_{2n}$ increases (and thus, as the resistance thereof increases), an overlapping area among the data lines $DL_1$~$DL_{2n}$ respectively connected to the data fan-out wirings $DF_1$~$DF_{2n}$ and the gate lines $GL_1$~$GL_m$ decreases (and thus, the capacitance thereof decreases), such that the signal delay deviation caused by the difference in length (and thus, the difference in resistance) of the data fan-out wirings $DF_1$~$DF_{2n}$ may be uniformly compensated.

Figure 6:
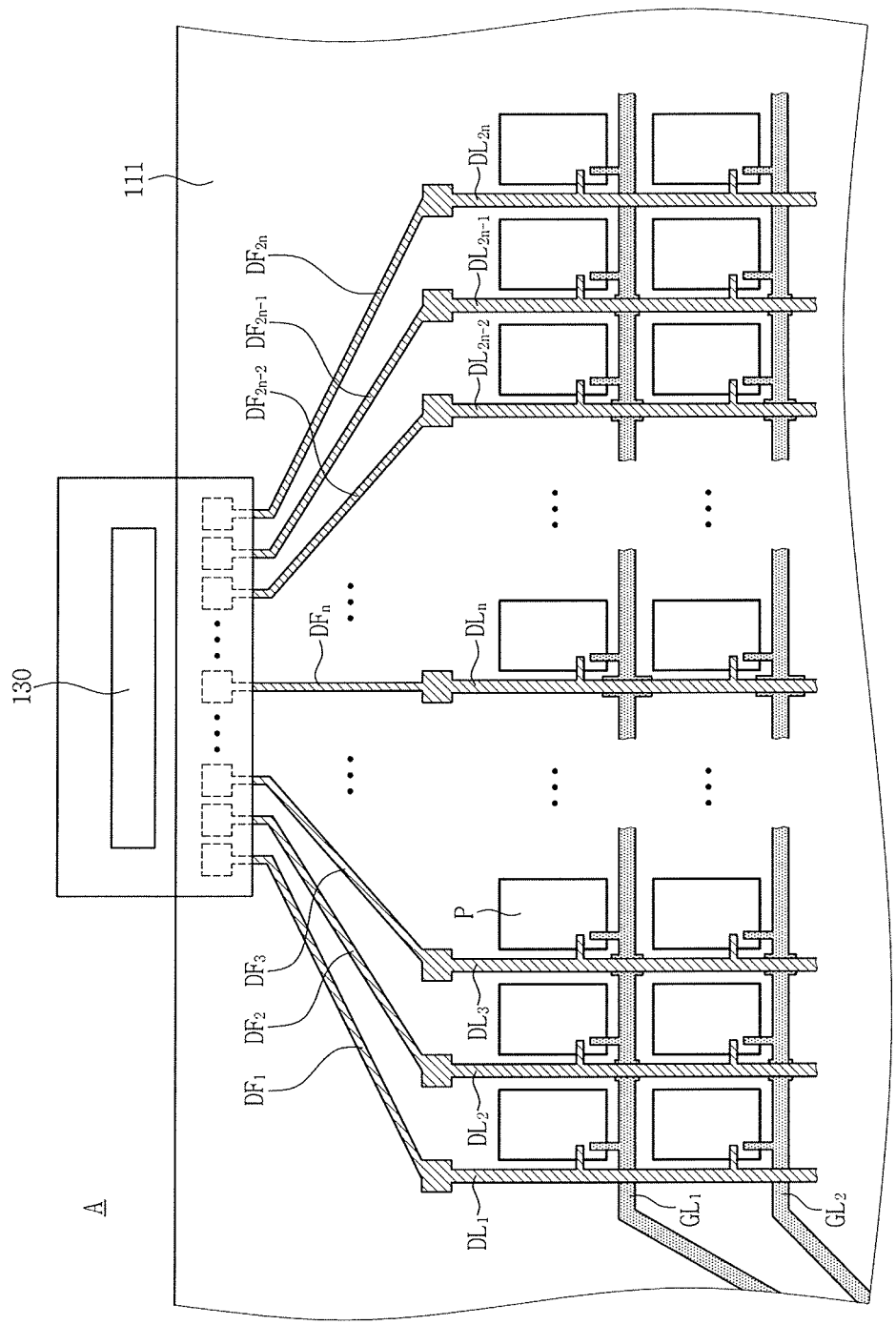
FIG. 6 is an enlarged view illustrating portion A of the display device of FIG. 1 according to an exemplary embodiment of the present invention.

FIG. 6 is an enlarged view illustrating portion A of the display device of FIG. 1 according to an exemplary embodiment of the present invention. For convenience of explanation, a further description of elements and configurations previously described may be omitted herein.

In reference to FIG. 6, the first data fan-out wiring $DF_1$ and the $2n^{th}$ data fan-out wiring $DF_{2n}$ are connected to a peripheral portion (also referred to herein as a side portion or end portion) of the data driver IC 130, and the $n^{th}$ data fan-out wiring $DF_n$ is connected to a center portion of the data driver IC 130.

Accordingly, the resistance decreases from the first data fan-out wiring $DF_1$ to the $n^{th}$ data fan-out wiring $DF_n$, and increases from the $n^{th}$ data fan-out wiring $DF_n$ to the $2n^{th}$ data fan-out wiring $DF_{2n}$.

The display device according to exemplary embodiments allows overlapping areas among the respective data lines $DL_1$~$DL_{2n}$ respectively connected to the data fan-out wirings $DF_1$~$DF_{2n}$ and the gate lines $GL_1$~$GL_m$ to be different from one another so as to compensate for the resistance deviation among the data fan-out wirings $DF_1$~$DF_{2n}$.

That is, by allowing parasitic capacitances formed between the respective data lines $DL_1$~$DL_{2n}$ and the gate lines $GL_1$~$GL_m$ to have different capacities for each of the data lines $DL_1$~$DL_{2n}$, the signal delay deviation caused by the difference in length (and thus, the difference in resistance) of the data fan-out wirings $DF_1$~$DF_{2n}$ may be uniformly compensated.

For example, the overlapping area of the data lines $DL_1$ and $DL_{2n}$, which are connected to the data fan-out wirings $DF_1$ and $DF_{2n}$ having the greatest length and the gate lines $GL_1$~$GL_m$, is the smallest among the overlapping areas, and the overlapping area of the data line $DL_n$, which is connected to the data fan-out wiring DF having the smallest length and the gate lines $GL_1$~$GL_m$, is the greatest among the overlapping areas. In addition, the overlapping area increases from the first data line $DL_1$ to the $n^{th}$ data line $DL_n$, and the overlapping area decreases from the $n^{th}$ data line $DL_n$ to the $2n^{th}$ data line $DL_{2n}$.

In the display device according to exemplary embodiments of the present invention, portions of the gate lines $GL_1$~$GL_m$ (e.g., referred to herein as first portions) overlapping portions of the data lines $DL_1$~$DL_{2n}$ (e.g., referred to herein as second portions) have a greater line width than the corresponding second portions. The line width of the portion of the respective gate lines $GL_1$~$GL_m$ overlapping the data lines $DL_1$~$DL_{2n}$ increases from the first data line $DL_1$ to the $n^{th}$ data line $DL_n$, and decreases from the $n^{th}$ data line $DL_n$ to the $2n^{th}$ data line $DL_{2n}$.

As described herein, as an overlapping area between the data line connected to the fan-out wiring and the gate line varies based on the length of the fan-out wiring, the display device according to exemplary embodiments of the present invention may achieve uniformity in the signal delay deviation caused by the difference in resistance among the fan-out wirings while having a narrow/thin bezel.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
   a substrate comprising a plurality of pixels disposed in a display area of the substrate, wherein a non-display area of the substrate is disposed adjacent to the display area;
   a plurality of gate lines and a plurality of data lines arranged in a matrix form in the display area on the substrate;
   at least one driver integrated circuit (IC) disposed in the non-display area on the substrate; and
   a plurality of data fan-out wirings disposed on the substrate and connecting the data lines and the at least one driver IC, wherein lengths of the data fan-out wirings vary,
   wherein widths of portions of the data lines that overlap the gate lines increases as the lengths of the corresponding connected data fan-out wirings decrease, and widths of other portions of the data lines that do not overlap the gate lines do not increase.

2. The display device of claim 1, wherein a capacitance between the data lines and the gate lines increases as the length of the corresponding data fan-out wiring decreases.

3. The display device of claim 1, wherein the lengths of the data fan-out wirings are substantially the same as a shortest distance between the driver IC and the corresponding data lines.

4. The display device of claim 1, wherein the data fan-out wirings comprise:
   a first data fan-out wiring connected to a first data line of the plurality of data lines, wherein the length of the first data fan-out wiring is a greatest length among the lengths of the data fan-out wirings; and
   an nth data fan-out wiring connected to an nth data line of the plurality of data lines, wherein the length of the nth data fan-out wiring is a smallest length among the lengths of the data fan-out wirings, n is an integer greater than or equal to 1, and the nth data fan-out wiring is disposed near a center portion of the at least one driver IC.

5. The display device of claim 4, wherein the lengths of the plurality of data fan-out wirings decrease from the first data fan-out wiring to the nth data fan-out wiring.

6. The display device of claim 4, wherein a resistance of the plurality of data fan-out wirings decreases from the first data fan-out wiring to the nth data fan-out wiring.

7. The display device of claim 4, wherein the data lines overlap the gate lines more from the first data line to the nth data line.

8. The display device of claim 4, wherein a capacitance between the data lines and the gate lines increases from the first data line to the nth data line.

9. The display device of claim 4, wherein the first data fan-out wiring is connected to an end portion of the at least one driver IC.

10. The display device of claim 4, wherein the nth data fan-out wiring is connected to the center portion of the at least one driver IC.

11. The display device of claim 1, further comprising:
    an insulating layer disposed between the gate lines and the data lines, wherein the insulating layer insulates the gate lines from the data lines.

12. The display device of claim 1, wherein the at least one driver IC is one of a plurality of driver ICs, and the plurality of driver ICs is arranged at a consistent interval.

13. The display device of claim 1, wherein the widths of the portions of at least one of the data lines that overlap the gate lines is greater than a width of a majority portion of the at least one of the data lines that does not overlap the gate lines.

14. A display device, comprising:
    a substrate comprising a plurality of pixels disposed in a display area of the substrate, wherein a non-display area of the substrate is disposed adjacent to the display area;
    a plurality of gate lines and a plurality of data lines arranged in a matrix form in the display area on the substrate;
    at least one driver integrated circuit (IC) disposed in the non-display area on the substrate; and
    a plurality of data fan-out wirings disposed on the substrate and connecting the data lines and the at least one driver IC, wherein lengths of the data fan-out wirings decrease from an end portion of the at least one driver IC toward a center portion of the at least one driver IC,
    wherein widths of portions of the data lines that overlap the gate lines increase as the lengths of the corresponding connected data fan-out wirings decrease, and widths of other portions of the data lines that do not overlap the gate lines do not increase.

15. The display device of claim 14, wherein the lengths of the data fan-out wirings are substantially the same as a shortest distance between the driver IC and the corresponding data lines.

16. The display device of claim 14, further comprising:
    an insulating layer disposed between the gate lines and the data lines, wherein the insulating layer insulates the gate lines from the data lines.

17. The display device of claim 14, wherein the widths of the portions of at least one of the data lines that overlap the gate lines is greater than a width of a majority portion of the at least one of the data lines that does not overlap the gate lines.

18. A display device, comprising:
    a substrate comprising a plurality of pixels disposed in a display area of the substrate, wherein a non-display area of the substrate is disposed adjacent to the display area;

a plurality of gate lines and a plurality of data lines arranged in a matrix form in the display area on the substrate;

at least one driver integrated circuit (IC) disposed in the non-display area on the substrate; and a plurality of data fan-out wirings disposed on the substrate and connecting the data lines and the at least one driver IC, wherein lengths of the data fan-out wirings decrease from an end portion of the at least one driver IC toward a center portion of the at least one driver IC, wherein widths of portions of the gate lines that overlap the data lines increase as the lengths of the data fan-out wiring connected to the corresponding overlapped data lines decrease.

19. The display device of claim 18, wherein the lengths of the data fan-out wirings are substantially the same as a shortest distance between the driver IC and the corresponding data lines.

20. The display device of claim 18 further comprising:

an insulating layer disposed between the gate lines and the data lines, wherein the insulating layer insulates the gate lines from the data lines.

\* \* \* \* \*